United States Patent
Wilson et al.

(10) Patent No.: US 9,960,784 B1
(45) Date of Patent: May 1, 2018

(54) ANALOG TO DIGITAL CONVERTERS

(71) Applicant: Hamilton Sundstrand Corporation, Charlotte, NC (US)

(72) Inventors: Michael A. Wilson, Scottsdale, AZ (US); Harold J. Reyes, Tempe, AZ (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days. days.

(21) Appl. No.: 15/487,055

(22) Filed: Apr. 13, 2017

(51) Int. Cl.
*H03M 1/34* (2006.01)
*H03M 1/12* (2006.01)
*H03M 1/48* (2006.01)

(52) U.S. Cl.
CPC ........... *H03M 1/34* (2013.01); *H03M 1/1245* (2013.01); *H03M 1/485* (2013.01)

(58) Field of Classification Search
CPC ....... H03M 1/34; H03M 1/1245; H03M 1/485
USPC .................... 341/111, 116, 155, 158
See application file for complete search history.

(56) References Cited

U.S. PATENT DOCUMENTS

| | | | |
|---|---|---|---|
| 3,789,393 A | 1/1974 | Tripp | |
| 6,567,922 B1 | 5/2003 | Feng | |
| 7,205,916 B1 * | 4/2007 | Stolan | H03M 1/485 318/661 |
| 7,248,994 B1 * | 7/2007 | Stolan | G01D 5/2291 324/207.11 |
| 7,696,791 B2 | 4/2010 | Hyvonen | |
| 9,059,641 B2 | 6/2015 | Courtel | |

OTHER PUBLICATIONS

Article in Texas Instruments Designs—Precision: Verified Design titled "Comparator With Hysteresis Reference Design" by Art Kay, Timothy Claycomb dated May 2013—Revised Jun. 2014.

* cited by examiner

*Primary Examiner* — Khai M Nguyen

(74) *Attorney, Agent, or Firm* — Locke Lord LLP; Scott D. Wofsy; Christopher J. Cillié

(57) ABSTRACT

A sinusoidal-amplitude-to-digital-output circuit includes a comparator with an input terminal, a reference terminal and an output terminal. A digital bus is connected to the output terminal. A reference voltage source is connected to the reference terminal. A feedback resistor is connected in parallel with the comparator between the output terminal and the input terminal to provide hysteresis for noise rejection such that circuit converts voltage received at the input terminal into a digital pulse-width modulated waveform that varies non-linearly with amplitude of the voltage received at the input terminal.

17 Claims, 4 Drawing Sheets

ANALOG TO DIGITAL CONVERTERS

BACKGROUND OF THE INVENTION

1. Field of the Invention

The present disclosure relates to signal conversion, and more particularly to analog to digital signal conversion for analog signal health monitoring.

2. Description of Related Art

Sensors, such as those employed on aircraft, commonly employ excitation voltages to sensors for purposes of monitoring a sensed parameter. For example, in rotating machinery like generators and motors resolvers are commonly employed to sense the rotational position and/or speed of a shaft. Such resolvers generally receive an excitation voltage that varies according to a desired sinusoidal waveform and typically provide an output signal indicative of the rotational position and/or speed of the shaft.

When providing a sinusoidal voltage excitation waveform it is often desirable to monitor the amplitude of the sinusoidal excitation voltage applied to the sensor. This is because the output of the sensor can change according to variation in the amplitude of the input excitation waveform, potentially changing output of the sensor for a given sensed parameter value. Monitoring the sinusoidal voltage excitation waveform generally involves feeding the sinusoidal signal through an analog-to-digital converter (ADC) device. ADC devices typically have a limited number of input channels, which can limit the number of parameters sensed in certain applications.

Such conventional methods and systems have generally been considered satisfactory for their intended purpose. However, there is still a need in the art for improved systems and methods for sensor excitation signal monitoring. The present disclosure provides a solution for this need.

SUMMARY OF THE INVENTION

A circuit to allow an amplitude and frequency of a sinusoidal voltage waveform to be digitally monitored includes an input and an output. The input is configured to receive a sinusoidal voltage waveform. The output is in operable communication with the input and is configured to provide a duty cycle having a nonlinear relationship to the amplitude of the sinusoidal voltage waveform such that an amplitude and frequency of the sinusoidal voltage waveform can be calculated from just the duty cycle.

In certain embodiments, the circuit can be a sinusoidal-amplitude-to-digital-output (SADO). The circuit can include a comparator with an input terminal, a reference terminal and an output terminal. A digital bus can be connected to the output terminal. A reference voltage source can be connected to the reference terminal. A feedback resistor can be connected in parallel with the comparator between the output and input terminals to provide hysteresis for noise rejection such that circuit convert voltage received at the input terminal into a digital pulse-width modulated waveform that varies non-linearly with amplitude of the voltage received at the to the input terminal.

In accordance with certain embodiments, the SADO circuit can include a plurality of interconnected discrete electronic components. A voltage divider circuit connected to the comparator input terminal to attenuate an input voltage received at the comparator input. A source resistor connected in series between a sine wave generator and the comparator input terminal. A ground resistor can be connected in series between ground and the comparator input terminal.

In accordance with further embodiments, a half-wave rectifier circuit can be connected to the comparator input terminal to half-wave rectify and clamp the input voltage received at the comparator input terminal to ground. The half-wave rectifier can include a diode connected between ground and the comparator input terminal. The diode can be arranged to oppose current flow from the comparator input terminal and ground.

It is also contemplated that, in accordance with certain embodiments, a hysteresis circuit. The hysteresis circuit can be connected between the comparator output terminal and the reference voltage terminal. The hysteresis circuit can include a reference resistor connected in series between the reference voltage source and the comparator reference terminal. The feedback resistor can be connected in series between the comparator output terminal and the comparator reference terminal. The feedback resistor can be arranged to set a width of a hysteresis band, i.e., a voltage separation between a low-to-high switching voltage and high-to-low switching voltage, of the comparator. A pull-up resistor can be connected in series between a pull-up voltage source and the comparator output.

A sensor interface includes a SADO circuit as described above, a sinewave generator connected to the comparator input terminal, and a digital bus connected to the comparator output terminal and the comparator reference terminal. In certain embodiments a field programmable gate array (FPGA) device or a microprocessor can be connected to the comparator output by the digital bus. The FPGA or microprocessor can be disposed in communication with a lookup having input voltage waveform frequency associated with input waveform amplitude.

A method of monitoring amplitude and frequency of a sinusoidal voltage waveform is shown. The method includes generating a digital pulse-width modulated (PWM) signal whose duty cycle varies non-linearly with amplitude of the sinusoidal voltage waveform. The digital PWM is analyzed, and amplitude and frequency representative of the sinusoidal voltage waveform are calculated using just the digital PWM signal.

In certain embodiments the method can be a method on monitoring excitation voltage for a sensor. An input voltage with a sinusoidal waveform can be received at a comparator input terminal and a reference voltage at a comparator reference terminal. An output voltage can be received at a comparator output terminal and switched from a first to a second voltage when amplitude of the input voltage rises above a low-to-high threshold. The output voltage can be switched from the second to the first voltage when amplitude of the input voltage drops below a low-to-high threshold.

In accordance with certain embodiments the low-to-high threshold can be less than the high-to-low threshold. The low-to-high threshold can be generated by offsetting the reference voltage by the first voltage after switching from the second to the first voltage. The high-to-low threshold can be generated by offsetting the reference voltage by the output voltage after switching from the first to the second voltage.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
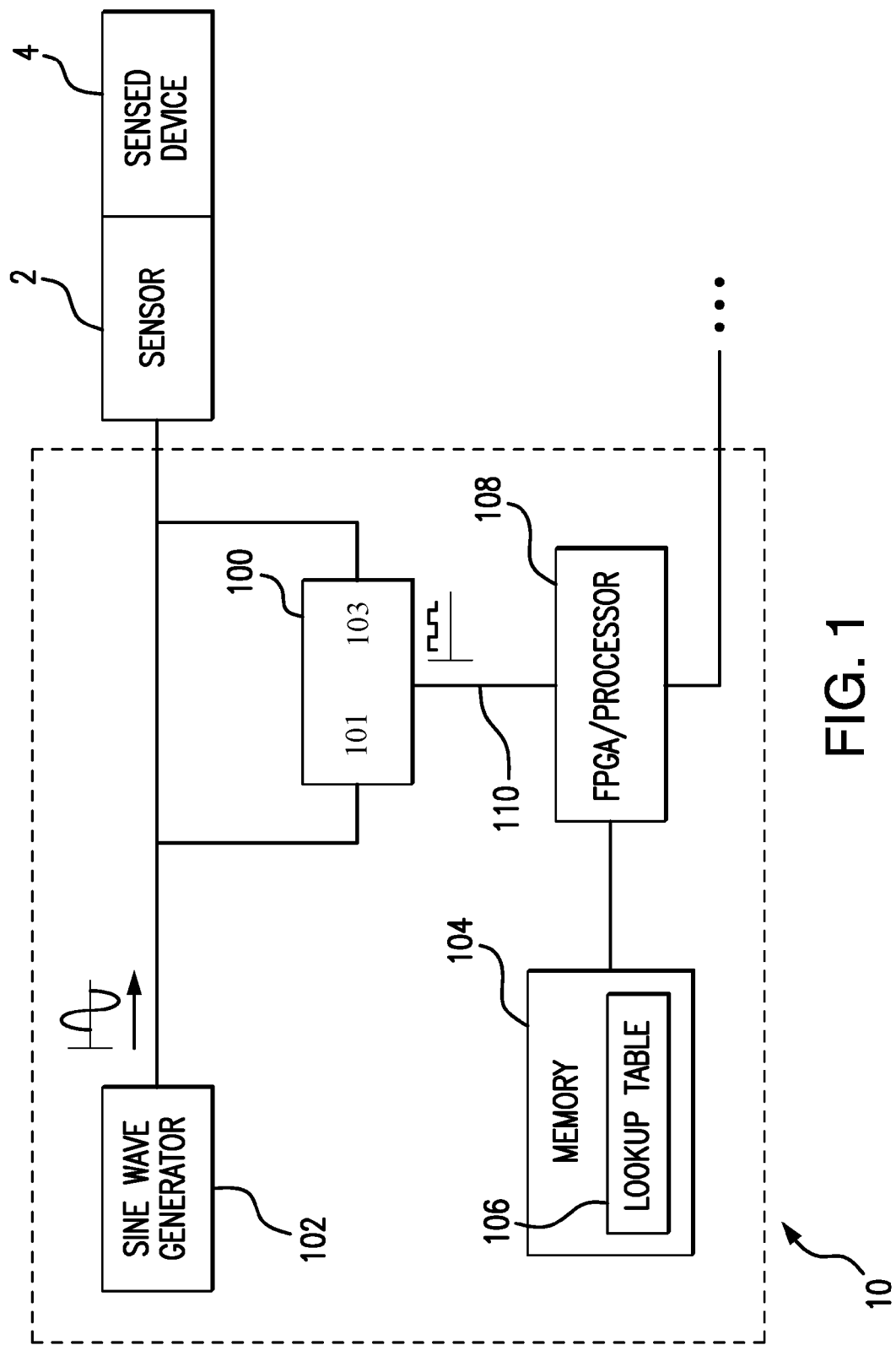
FIG. 1 is a schematic view of an exemplary embodiment sensor interface with a sinusoidal-amplitude-to-digital-output (SADO) circuit constructed in accordance with the present disclosure, showing the sensor interface connected between a sine wave generator and a sensor.

Reference will now be made to the drawings wherein like reference numerals identify similar structural features or aspects of the subject disclosure. For purposes of explanation and illustration, and not limitation, a partial view of an exemplary embodiment of a circuit to allow an amplitude and frequency of a sinusoidal voltage waveform to be digitally monitored in accordance with the disclosure is shown in FIG. 1 and is designated generally by reference character 100. Other embodiments of such circuits, sensors interfaces employing such circuits, and methods of monitoring amplitude and frequency of sinusoidal voltage waveforms in accordance with the disclosure, or aspects thereof, are provided in FIGS. 2-5, as will be described. The systems and methods described herein can be used for monitoring excitation voltages applied to sensors, such as resolvers operably coupled to rotating machinery in aircraft, though the present disclosure is not limited to resolvers or to rotating machinery in general.

Referring to FIG. 1, circuit 100 is shown. Circuit 100 generally includes an input 101 configured to receive a sinusoidal voltage waveform and an output 103 in operable communication with input 101. Output 103 is configured to provide a duty cycle having a nonlinear relationship to the amplitude of the sinusoidal voltage waveform such that an amplitude and frequency of the sinusoidal voltage waveform can be calculated from just the duty cycle.

In the illustrated exemplary embodiment circuit 100 is sinusoidal amplitude-to-digital-output (SADO) circuit included in sensor interface 10. Sensor interface 10 is connected to a sensor 2 and includes a SADO circuit 100, a sine wave generator 102, a memory 104 with a lookup table 106, and field-programmable-gate-array (FPGA) device or processor 108. Sine wave generator 102 is connected to SADO circuit 100 and sensor 2. FPGA device or processor 108 is connected to SADO circuit 100 via a digital bus 110 and is disposed in communication with memory 104. Lookup table 106 includes an association of sinusoid voltage to amplitude digital output due cycle percentage for an input voltage provided by sine wave generator 102 to SADO circuit 100 and sensor 2. Sensor 2 in coupled to a sensed device 4 for determining a parameter of sensed device 4. Sensed device 4 is resolver arranged to generate signal indicative of rotational positon of rotating machine 6 using an excitation voltage received at sensor 2 by sine wave generator 102. It is to be understood and appreciated that this is for explanation purposes only, and that sensor 2 can be any device employing an excitation voltage with a sinusoidal waveform.

Figure 2:
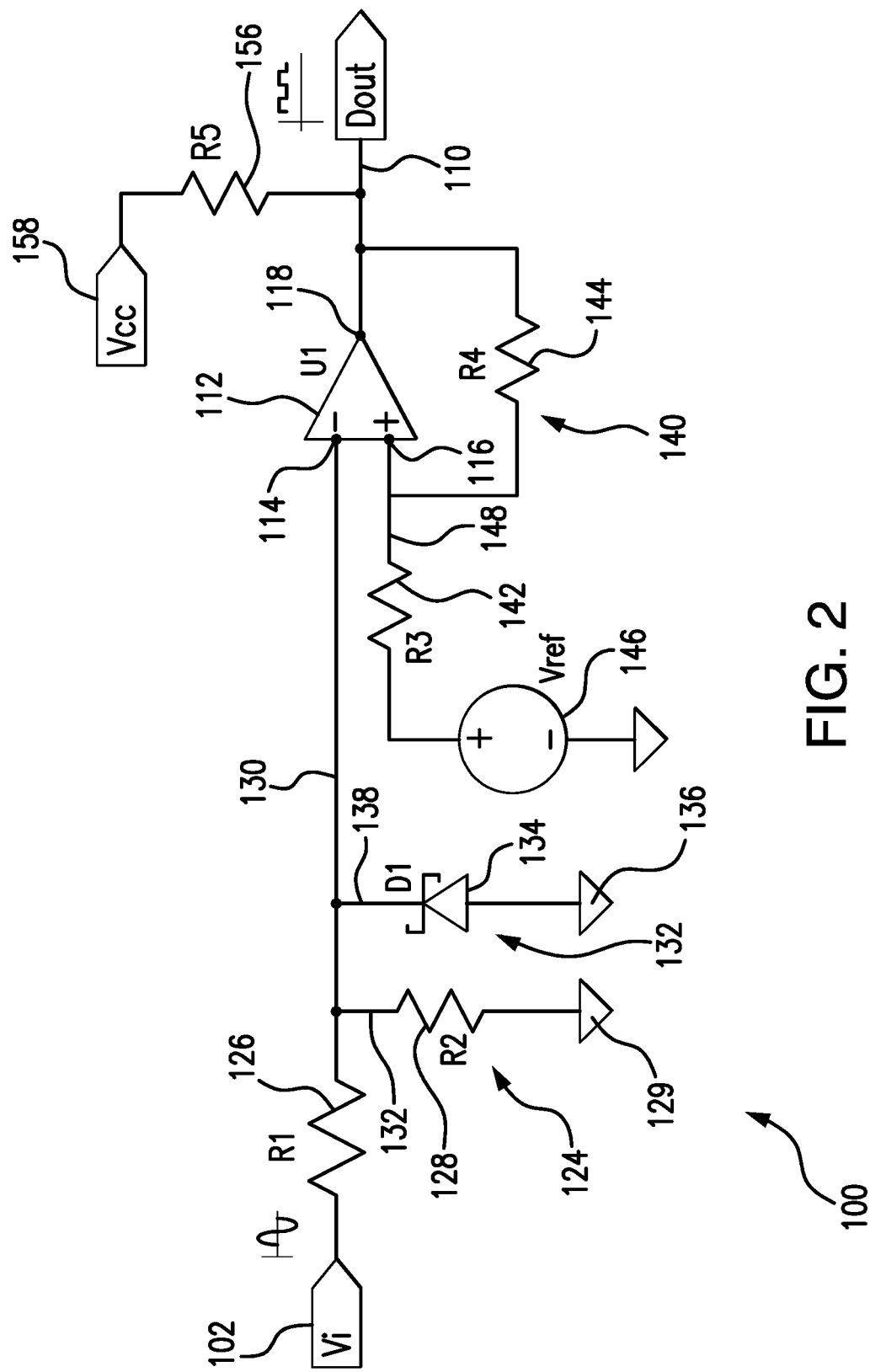
FIG. 2 is a circuit diagram of the sensor interface of FIG. 1, showing discrete electronic components of the SADO circuit interconnected with one another.

With reference to FIG. 2, a circuit diagram of SADO circuit 100 is shown. SADO circuit 100 includes a comparator 112 with an input terminal 114, a reference terminal 116, and an output terminal 118. Digital bus 110 is connected to output terminal 118. A reference voltage source 120 is connected to reference terminal 116. A feedback resistor 122 is connected in parallel between output terminal 118 and input terminal 114 to convert voltage, e.g., sinusoidal voltage shown in FIG. 1, received at input terminal 114 into a digital pulse-width modulated waveform (shown in FIG. 1) that varies non-linearly with amplitude of the voltage received at input terminal 114 (shown in FIG. 4). It is contemplated that SADO circuit 100 include a plurality of discrete electronic components interconnected with one, e.g., resistors and diodes less than fully implemented in silicon.

SADO circuit 100 also includes a voltage divider circuit 124. Voltage divider circuit 124 is connected to input terminal 114 and has a source resistor 126 and a ground resistor 128. Source resistor 126 is connected in series between sine wave generator 102 and input terminal 114. Ground resistor 128 is connected in series between a ground terminal 129 and input terminal 114. A ground lead 131 connects ground resistor 128 to an input lead 130 at a location between source resistor 126 and input terminal 114. Voltage divider circuit 124 is arranged, e.g., via respective resistances of source resistor 126 and ground resistor 128, to attenuate voltage of the excitation waveform (shown in FIG. 1) applied to input terminal 114.

SADO circuit 100 additionally includes a half-wave rectifier circuit 132. Half-wave rectifier circuit 132 is connected to input terminal 114 and includes a diode 134. Diode 134 is connected in series between a ground terminal 129 and input terminal 114, and further connected to input lead 130 at a location between the connection of ground lead 131 and input terminal 114 via a diode lead 138. Diode 134 is arranged to oppose current flow from input lead 130, i.e. from input terminal 114 and sine wave generator 102, to ground terminal 136 to half-wave rectify and clamp input voltage received at input terminal 114 to ground. In the illustrated exemplary embodiment diode 134 is a Schottky diode, which provides good efficiency at high switching speeds.

SADO circuit 100 further includes a hysteresis circuit 140. Hysteresis circuit 140 is connected between output terminal 118 and reference terminal 116 and includes a reference resistor 142 and a feedback resistor 144. Reference resistor 142 is connected in series between a reference voltage source 146 and reference terminal 116. Reference voltage source 146 sets a trip threshold for comparator 112. Feedback resistor 144 is connected in parallel with comparator 112, interconnects output terminal 118 with reference terminal 116, and is connected to reference voltage lead 148 at a location between reference terminal 116 and reference resistor 142.

It is contemplated that feedback resistor 144 be arranged to set a width of a hysteresis band (shown in FIG. 3) of SADO circuit 100, i.e. a voltage separation 174 (shown in FIG. 3) between a low-to-high switching threshold 172

Figure 3:
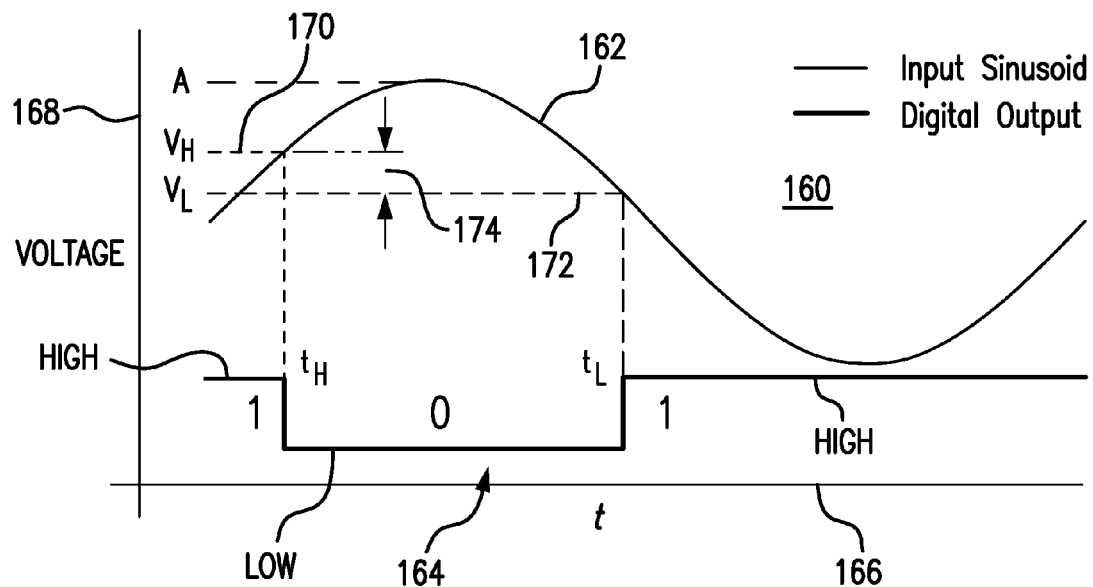
FIGS. 3 and 4 are graphs of output of the SADO circuit of FIG. 1, showing digital output duty cycle percentage as a function of input voltage amplitude and digital output for an exemplary waveform, respectively.

(shown in FIG. 3) and a high-to-low switching threshold 170 (shown in FIG. 3). The width of the hysteresis band is established at least in part based upon resistance of a pull-up resistor 156 connecting a digital bus pull-up voltage source 158 in series to digital bus 110.

With reference to FIG. 3, a graph 160 of an input waveform 162 and a digital output waveform 164 are shown. Time is indicated on x-axis 166. Voltage is indicted at y-axis 168. Input waveform 162 is provided to SADO circuit 100 (shown in FIG. 1) in a sampling arrangement, shown in an exemplary way in FIG. 1 with SADO circuit 100 being connected in parallel with an excitation lead extending between sine wave generator 102 and sensor 2, from sine wave generator 102 (shown in FIG. 1).

As input waveform 162 arrives SADO circuit 100 converts input waveform 162 into digital output waveform 164, which SADO circuit 100 provides to digital bus 110. The above-described circuitry pulse width modulates digital output waveform 164 according to time interval, e.g., the low interval shown in FIG. 3, between a high-to-low threshold 170 ($V_H$) and low-to-high threshold 172 ($V_L$). High-to-low threshold 170 ($V_H$) is greater than low-to-high threshold 172 ($V_L$), a wide hysteresis band 174 of SADO circuit 100 separating high-to-low threshold 170 ($V_H$) and low-to-high threshold 172 ($V_L$).

SADO circuit 100 compares voltage amplitude of input waveform 162 against high-to-low voltage threshold 170 during intervals when digital output waveform 164 is 'high', e.g., a '1', and further compares the voltage amplitude of input waveform 162 against low-to-high threshold 172 when digital output waveform 164 is 'low', e.g., is a zero. High-to-low voltage threshold 170 ($V_H$) and low-to-high threshold 172 ($V_L$) are separated in voltage magnitude by a wide hysteresis band 174, which is established by hysteresis circuit 140 (shown in FIG. 2) and operates to switch the reference voltage applied to reference terminal 116 (shown in FIG. 2) according to whether digital output waveform 164 is high or low. The proportion of time during which the digital output waveform 164 is high corresponds to the duty cycle modulated into digital output waveform 164, which is provided in real-time to FPGA device or processor 108 for determining health of input waveform 162.

Figure 4:
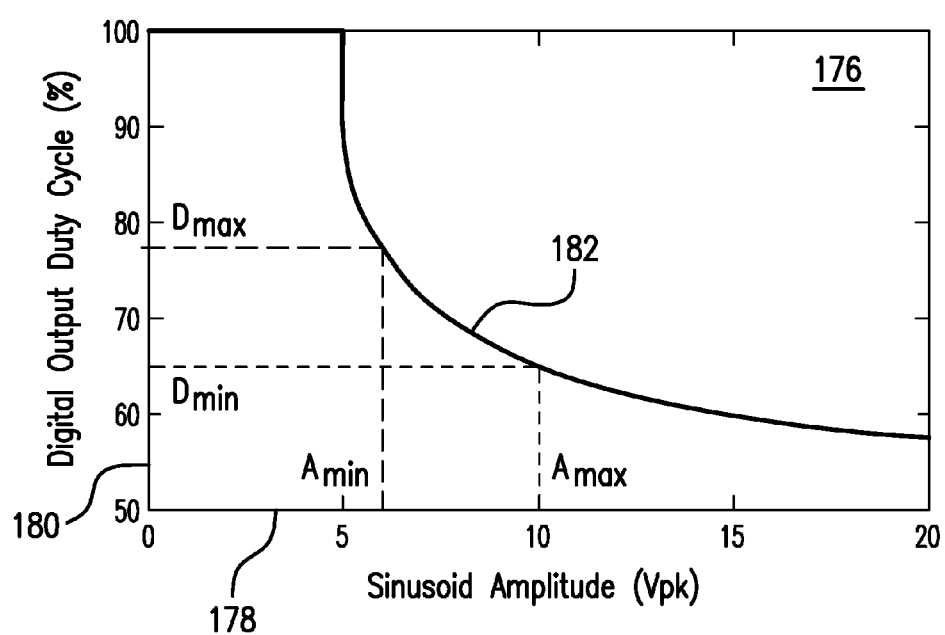

With reference to FIG. 4, a graph 176 of duty cycle D born by digital output wavefrom 164 (shown in FIG. 3) in association with amplitude A of input waveform 162 (shown in FIG. 3) is shown. Amplitude A is expressed in volts on x-axis 178. Duty cycle D is expressed as a percentage on y-axis 180. A duty cycle function 182 extends from 0 volts on the left-hand side of graph 176 to about 20 volts on the right-hand side of graph 176, duty cycle function 182 varying in a non-linear with amplitude A. As will be appreciated by those of skill in art in view of the present disclosure, the non-linearity of duty cycle function 182 allows FPGA device or processor 108 (shown in FIG. 1) to calculate both sinusoidal frequency and amplitude using only a single digital input, i.e., digital output waveform 164 (shown in FIG. 3).

Frequency is calculated by measuring time intervals between rising and falling edges of digital output wavefrom 164. Amplitude of input waveform 162 is determined by referencing an observed duty cycle (via pulse-width modulation imparted to digital output waveform 164) with an associated amplitude according to duty cycle function 182. In an exemplary implementation shown in FIG. 4, a duty cycle of 78% is cross-referenced in lookup table 106 (shown in FIG. 1) to recognize that amplitude of input waveform 162 is about 6 volts. This amplitude can then be compared against a selected voltage value, or minimum to maximum voltage range (i.e., $A_{MIN}$ to $A_{MAX}$), to assess health of input waveform 162.

Duty cycle function 182 is arrived at via SADO circuitry shown in FIG. 2 as follows. Input waveform 162 a sinusoidal waveform with amplitude A and an angular frequency ω, and generally conforms to Equation 1:

$$V_i(t) = A \sin(\omega t)$$

Assuming comparator 112 (shown in FIG. 2) has a high-to-low threshold $V_H$ and a low-to-high threshold $V_L$, then the time associated with input waveform 160 crossing high-to-low threshold $V_H$ is according to Equation 2:

$$t_H = \frac{1}{\omega} \sin^{-1}\left(\frac{V_H}{A}\right)$$

The time associated with input waveform 162 crossing low-to-high threshold $V_L$ is according to Equation 3:

$$t_L = \frac{\pi}{\omega} - \frac{1}{\omega} \sin^{-1}\left(\frac{V_L}{A}\right)$$

The duty cycle D of the input waveform is according to Equation 4:

$$D = 1 + \frac{\omega t_H}{2\pi} - \frac{\omega t_L}{2\pi}$$

Substituting Equation 2 and Equation 3 into Equation 4, and accounting for the constraint imposed by the dome of the arcsine yields an expression that is independent of angular frequency according to Equation 5:

$$D = \begin{cases} 1 & A < V_H \\ 0.5 + \frac{1}{2\pi}\left[\sin^{-1}\left(\frac{V_H}{A}\right) + \sin^{-1}\left(\frac{V_L}{A}\right)\right] & A \geq V_H \end{cases}$$

which is illustrated graphically in FIG. 4 with duty cycle function 182.

In certain embodiments, output of SADO circuit 100 (shown in FIG. 1) is not as accurate as output from a dedicated analog-to-digital converter. However, using discrete components, embodiments of SADO circuit 100 can realize amplitude measurement accuracy of about +/−10% of actual amplitude, which is generally sufficient for sensor interfaces, e.g., sensor interface 10 (shown in FIG. 1).

Figure 5:
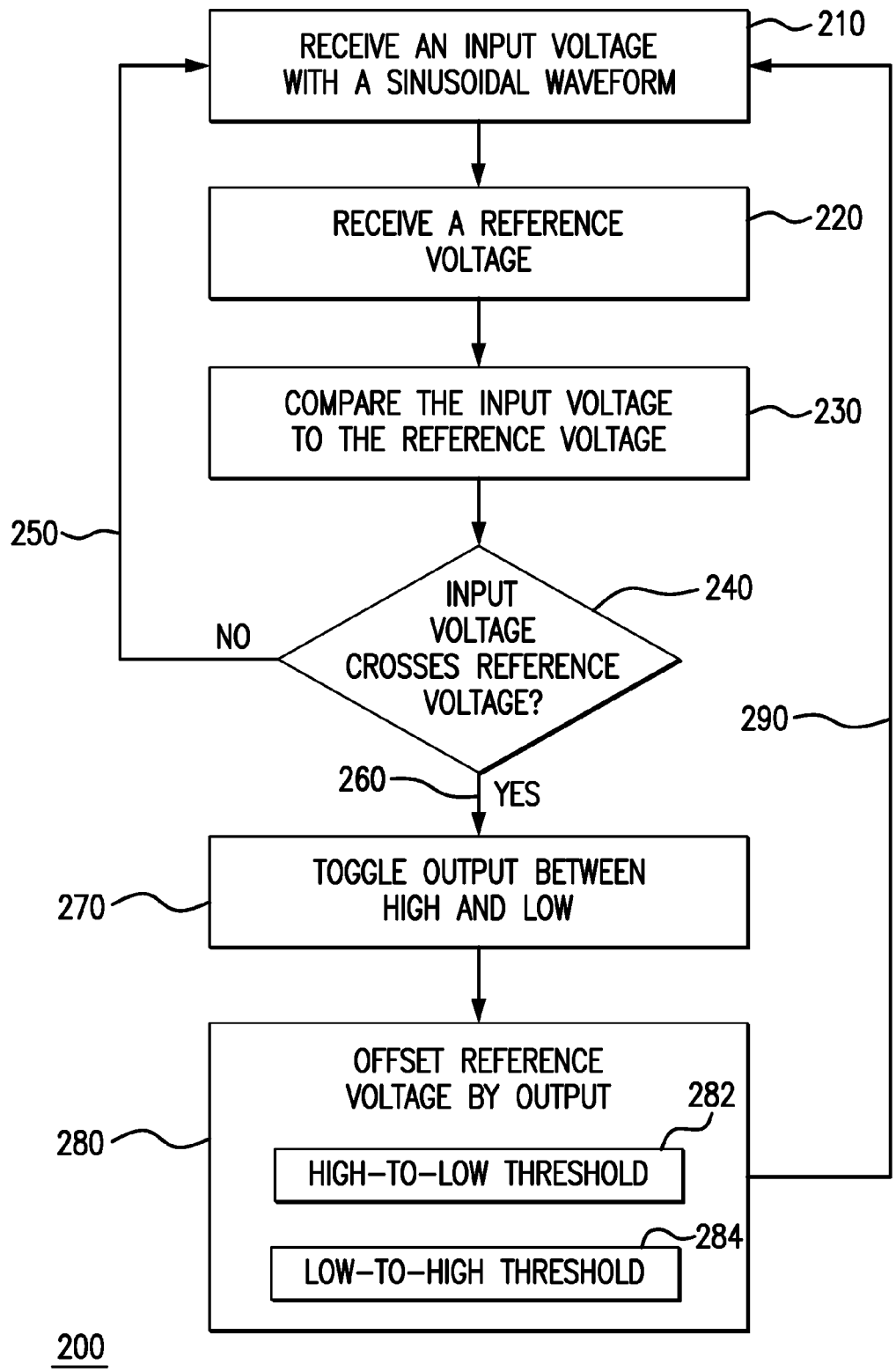
FIG. 5 is a process flow diagram for a method of converting a sinusoidal waveform into a pulse-width modulated output waveform, showing steps of the method.

With reference to FIG. 5, a method 200 of monitoring amplitude and frequency of a sinusoidal voltage waveform is shown. Method 200 includes generating a digital PWM signal whose duty cycle varies non-linearly with amplitude of the sinusoidal voltage waveform. The digital PWM is analyzed, and amplitude and frequency representative of the sinusoidal voltage waveform are calculated using just the digital PWM signal. In the illustrated exemplary embodiment a method of monitoring excitation voltage for a sensor, e.g., sensor 2 (shown in FIG. 1) is shown. It is to be understood and appreciated that this is for illustration purposes only and is non-limiting.

Method 200 includes receiving an input voltage with a sinusoidal waveform (shown in FIG. 2) at a comparator input terminal, e.g., input terminal 114 (shown in FIG. 2), as shown with box 210. Method 200 also includes receiving a reference voltage (shown in FIG. 3) at a comparator reference terminal, e.g., reference terminal 116 (shown in FIG. 1), as shown with box 220. Amplitude of the input voltage is compared to the reference voltage, as shown with box 230. If the input voltage is not greater than the reference voltage then output of the SADO circuit remains the same and monitoring continues, as shown with arrow 250.

When the comparison indicates that the input voltage is greater than the reference voltage then the output of the SADO circuit is toggled between high and low, as shown with arrow 260 and box 270. The reference voltage is then offset with the toggled output, as shown with box 280. The offsetting can change the reference from a high-to-low threshold to a low-to-high threshold, as shown with box 282. The offsetting can change the reference from a low-to-high threshold to a high-to-low threshold, as shown with box 284. The magnitude of the reference voltage changes according when the waveform is switched high or low. It is contemplated that monitoring can continue with output being toggled between high and low according a wide hysteresis defined between the low-to-high and high-to-low thresholds to synthesize a PWM digital output, as shown with arrow 290.

When providing a sinusoidal voltage excitation waveform it can be desirable to monitor amplitude of the sinusoid. Usually this involves feeding the sinusoid back through an analog-to-digital converter (ADC). While generally satisfactory for its intended purpose, the number of ADC channels available in a given application may be such that no monitoring channel is available to receive the sinusoidal waveform.

In embodiments described herein a SADO circuit is provided. The SADO circuit is configured to convert an input voltage varying according to a sinusoidal waveform to a digital pulse-width modulated (PWM) output, the PWM output duty cycle varying nonlinearly with amplitude of the sinusoidal waveform. Varying the PWM output duty cycle nonlinearly with the sinusoidal voltage amplitude allows a microprocessor or a field-programmable gate array (FPGA) to calculate both sinusoidal frequency and amplitude using only a single digital input, i.e., the SADO circuit output. This allows for sinusoidal amplitude and frequency monitoring using digital inputs instead of analog inputs, potentially reducing cost as digital inputs can be more readily implemented than analog inputs.

The methods and systems of the present disclosure, as described above and shown in the drawings, provide for sensor interfaces with superior properties including the sinusoidal excitation voltage waveform amplitude and frequency monitoring with the use of an ADC. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A circuit to allow an amplitude and frequency of a sinusoidal voltage waveform to be digitally monitored, comprising:
   an input configured to receive the sinusoidal voltage waveform; and
   an output in operable communication with the input configured to provide a duty cycle having a nonlinear relationship to the amplitude of the sinusoidal voltage waveform such that an amplitude and frequency of the sinusoidal voltage waveform can be calculated from just the duty cycle,
   wherein the circuit is a sinusoidal-amplitude-to-digital-output (SADO) circuit, wherein the input and output comprise:
   a comparator with an input terminal, a reference terminal, and an output terminal;
   a digital bus connected to the output terminal;
   a reference voltage source connected to the reference terminal; and
   a feedback resistor connected in parallel between the output terminal and the input terminal to convert an input voltage received at the input terminal into a digital pulse-width modulated (PWM) waveform that varies non-linearly with amplitude of the input voltage.

2. The circuit as recited in claim 1, further comprising a voltage divider circuit connected to the comparator input terminal to attenuate the input voltage.

3. The circuit as recited in claim 1, further comprising a half-wave rectifier circuit connected to the comparator input circuit to half-wave rectify and clamp the input voltage.

4. The circuit as recited in claim 3, wherein the half-wave rectifier circuit includes a Schottky diode arranged to oppose current flow from the comparator input terminal to ground.

5. The circuit as recited in claim 1, further comprising a resistor connected in series between the reference voltage source and the comparator reference terminal.

6. The circuit as recited in claim 1, wherein the feedback resistor is arranged to set a width of a hysteresis band of the comparator.

7. The circuit as recited in claim 1, further comprising a pull-up resistor connected in series between the digital bus and a digital bus voltage source.

8. The circuit as recited in claim 1, wherein output of the circuit has an output duty cycle according to:

$$D = \begin{cases} 1 & A < V_H \\ 0.5 + \dfrac{1}{2\pi}\left[\sin^{-1}\left(\dfrac{V_H}{A}\right) + \sin^{-1}\left(\dfrac{V_L}{A}\right)\right] & A \geq V_H \end{cases}.$$

9. The SADO circuit as recited in claim 1, wherein the circuit is implemented with a plurality of discrete electronic components connected to one another.

10. A sensor interface, comprising:
   a circuit as recited in claim 1;
   a sine wave generator connected to the input terminal of the comparator; and
   a digital bus connected to the output terminal and the reference terminal of the comparator.

11. The sensor interface as recited in claim 10, further comprising a field programmable gate array (FPGA) or microprocessor device connected to the digital bus and configured to calculate both frequency and amplitude of a waveform of the input voltage using the PWM waveform received at the comparator output terminal.

12. The sensor interface as recited in claim 11, further comprising a lookup table accessible by the FPGA or microprocessor device with voltage amplitude associated with duty cycle.

13. A method of monitoring amplitude and frequency of a sinusoidal voltage waveform comprising:
   receiving an input voltage with a sinusoidal waveform at a comparator input terminal;

receiving a reference voltage at a comparator reference terminal;

generating a digital pulse width modulation (PWM) signal whose duty cycle varies nonlinearly with an amplitude of the sinusoidal voltage waveform;

analyzing the digital PWM signal;

calculating, using the just the digital PWM signal, an amplitude and frequency representative of the sinusoidal voltage waveform;

switching an output voltage applied at a comparator output terminal from a first voltage to a second voltage when amplitude of the input voltage crosses a low-to-high threshold; and switching the output voltage applied at the comparator output terminal from the second voltage to the first voltage when amplitude of the input voltage crosses a high-to-low threshold.

14. The method as recited in claim 13, wherein the sinusoidal waveform is an excitation voltage for a sensor.

15. The method as recited in claim 13, wherein the high-to-low threshold is greater than the low-to-high threshold.

16. The method as recited in claim 13, further comprising generating the low-to-high threshold by offsetting the reference voltage by the first voltage subsequent to switching from the second voltage to the first voltage.

17. The method as recited in claim 13, further comprising generating the high-to-low threshold by offsetting the reference voltage offset by the second voltage subsequent to switching from the first voltage to the second voltage.

* * * * *